(12) United States Patent
Foust et al.

(10) Patent No.: US 7,348,738 B2
(45) Date of Patent: Mar. 25, 2008

(54) OLED AREA ILLUMINATION SOURCE

(75) Inventors: Donald Franklin Foust, Scotia, NY (US); Anil Raj Duggal, Niskayuna, NY (US); Joseph John Shiang, Niskayuna, NY (US); William Francis Nealon, Gloversville, NY (US); Jacob Charles Bortscheller, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 215 days.

(21) Appl. No.: 10/934,015

(22) Filed: Sep. 2, 2004

(65) Prior Publication Data

US 2006/0043912 A1   Mar. 2, 2006

(51) Int. Cl.
*H05B 37/00* (2006.01)
*F21V 11/00* (2006.01)
*F21V 15/00* (2006.01)
*G09G 5/00* (2006.01)

(52) U.S. Cl. ............... 315/312; 362/367; 362/368; 345/1.3

(58) Field of Classification Search ............ 313/483, 313/498, 502–504, 116; 345/1.1, 1.3, 3.1; 439/44, 45, 46; 362/367, 368; 315/312
See application file for complete search history.

(56) References Cited

U.S. PATENT DOCUMENTS

| 6,259,838 | B1 | 7/2001 | Singh et al. ............ 385/31 |
| 6,515,417 | B1 | 2/2003 | Duggal et al. ......... 313/506 |
| 6,565,631 | B2 | 5/2003 | Koros et al. .............. 96/8 |
| 6,771,021 | B2 | 8/2004 | Cok .................... 313/512 |
| 6,776,496 | B2 | 8/2004 | Cok .................... 362/84 |
| 6,800,999 | B1* | 10/2004 | Duggal et al. ....... 315/169.1 |
| 7,049,757 | B2* | 5/2006 | Foust et al. ......... 315/185 S |
| 2004/0042199 | A1 | 3/2004 | Cok .................... 362/84 |
| 2004/0061439 | A1 | 4/2004 | Cok .................... 313/512 |
| 2004/0113550 | A1 | 6/2004 | Adachi et al. ......... 313/512 |
| 2004/0121508 | A1 | 6/2004 | Foust et al. ........... 438/99 |
| 2005/0070039 | A1* | 3/2005 | Yamazaki et al. ...... 438/33 |
| 2006/0003487 | A1* | 1/2006 | Chung ................. 438/82 |

OTHER PUBLICATIONS

Anil R. Duggal et al., "Organic Light-Emitting Devices for Illumination Quality White Light", American Institute of Physics, Applied Physics Letters, vol. 80, No. 19, pp. 3470-3472, May 13, 2002.
Anil R. Duggal et al., "Fault-Tolerant, Scalable Organic Light-Emitting Device Architecture", American Institute of Physics, Applied Physics Letters, vol. 82, No. 16, pp. 2580-2582, Apr. 21, 2003.

* cited by examiner

*Primary Examiner*—Thuy Vinh Tran
(74) *Attorney, Agent, or Firm*—Mary Louise Gioeni; William E. Powell, III

(57) ABSTRACT

The present invention relates to an area illumination light source comprising a plurality of individual OLED panels. The individual OLED panels are configured in a physically modular fashion. Each OLED panel comprising a plurality of OLED devices. Each OLED panel comprises a first electrode and a second electrode such that the power being supplied to each individual OLED panel may be varied independently. A power supply unit capable of delivering varying levels of voltage simultaneously to the first and second electrodes of each of the individual OLED panels is also provided. The area illumination light source also comprises a mount within which the OLED panels are arrayed.

26 Claims, 7 Drawing Sheets

OLED AREA ILLUMINATION SOURCE

STATEMENT REGARDING FEDERALLY SPONSORED RESEARCH & DEVELOPMENT

This invention was made with Government support under contract number DE-FC26-00NT40989 awarded by Department of Energy. The Government has certain rights in the invention.

BACKGROUND

The invention relates generally to the use of organic light emitting devices (OLEDs) for area illumination. More particularly, the invention relates to an area illumination source having a modular array of OLED panels.

For many lighting applications, it is desirable to have extended area illumination sources. In such cases, for OLEDs to be effective alternatives to conventional illumination sources, large panel OLEDs are required. With currently available OLED panels, in order to illuminate an area the size of a typical room, approximately four square feet of light-emitting area is needed. Although, it may theoretically be possible to increase the size of an OLED panel to facilitate area illumination using a single OLED panel, a defect anywhere in a large panel may necessitate scrapping the entire panel. Also, such large panel OLEDs are not easily fabricated.

Prior approaches for OLED area illumination sources include non-modular arrays of OLEDs and physically modular, but electrically non-modular arrays of OLEDs. Neither approach enhances the quality of light output at the level of the array, rather improvements occur at the level of the light-emitting panel.

It would be highly desirable to provide an area illumination source comprising a plurality of OLED panels configured in a physically modular fashion and in which the light output of each of the individual OLED panels could be controlled independently.

BRIEF DESCRIPTION OF THE INVENTION

The present invention relates to an area illumination light source comprising a plurality of individual OLED panels. The individual OLED panels are configured in a physically modular fashion in which each OLED panel comprises a plurality of OLED devices. Each OLED panel comprises a first electrode and a second electrode such that the power being supplied to each individual OLED panel may be varied independently. A power supply unit capable of delivering varying levels of voltage simultaneously to the first and second electrodes of each of the individual OLED panels is also provided. The area illumination light source further comprises a mount within which the OLED panels are arrayed.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As used herein, the term "OLED" refers to organic light emitting devices comprising electroactive organic light emitting materials generally, and includes but is not limited to organic light emitting diodes.

As used herein, the term "OLED device" refers to the basic light-producing unit of the area illumination sources of the present invention, comprising at least two electrodes with a light-emitting organic material disposed between the two electrodes.

As used herein, the term "substrate" refers to a non-active mechanical support onto which the OLED device is fabricated.

As used herein the term "OLED panel" refers to an assembly comprising a substrate upon which is disposed a plurality of OLED devices. The devices may be individually addressable or electrically connected so that a single pair of electrical connections provide power to each OLED device disposed within the panel.

As used herein, the term "mount" refers to a mechanical support for a plurality of panels.

As used herein, the term "OLED array" refers to a plurality of OLED panels on a mount.

As used herein, the terms "OLED area illumination source" and "area illumination source" refer to a light source comprising an array of OLED panels.

As used herein, the term "physically modular" refers to an attribute of a module whereby the module can be removed or replaced without dismantling or removing any other module. For example, the panels comprised within the area illumination source of the present invention are "modular" in that a single panel of an OLED array may be easily replaced without dismantling or removing any other panel.

As used herein, the term "electrically modular" refers to an attribute of a module whereby the module can be independently electrically controlled. For example, panels disposed within the area illumination source of the present invention are "electrically modular" in that the voltage applied to each individual panel may be varied independently.

It has long been considered difficult to manufacture large, flat panel area illumination sources. The problem has been solved in the present invention by arraying many small light-producing panels in such a manner that the total output appears to be from a single source. The present invention provides for improvements at the OLED array level and at the OLED panel level. The present invention includes mechanical, electrical and optical improvements over existing designs. In one embodiment the present invention provides a flat panel large area illumination source.

Figure 1:
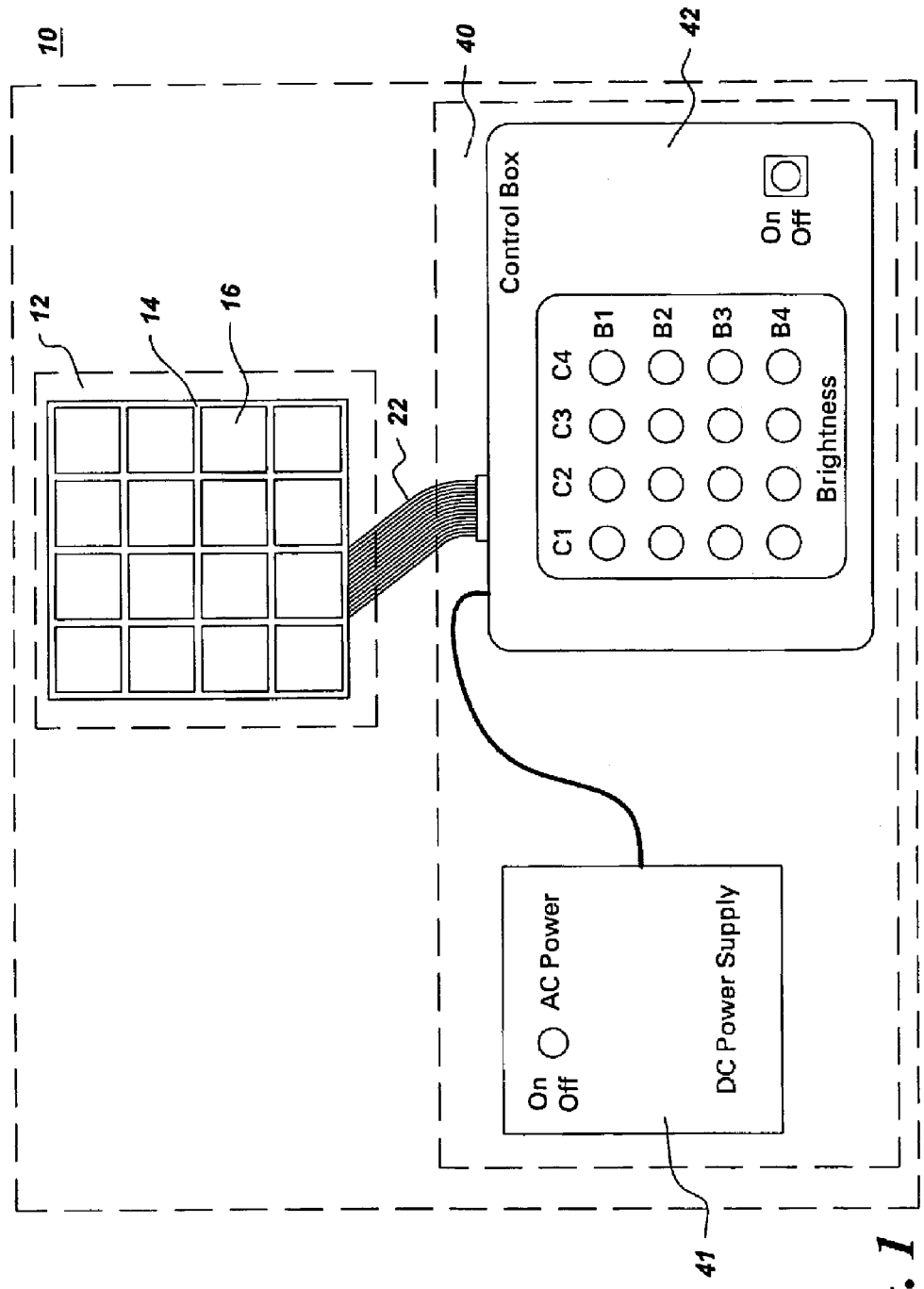
FIG. 1 shows schematically an embodiment of an area illumination source of the present invention.

Referring to drawings in general and to FIG. 1 in particular, the illustrations are for the purpose of describing an embodiment or aspect of the invention and are not intended to limit the invention. FIG. 1 illustrates an area illumination source 10 according to a first embodiment of the present invention. The area illumination source 10 of FIG. 1 includes an OLED array 12 comprising a mount 14. The OLED array 12 comprises a plurality of OLED panels 16. Each of said OLED panels 16 comprises a first electrode and a second electrode which deliver electrical power to each of the individual OLED devices comprising the OLED panel. FIG. 1 illustrates an embodiment of the invention in which sixteen OLED panels 16 are disposed within a mount 14 to form an OLED array 12 which forms the light-emitting component of area illumination source 10. Typically, the number of OLED panels 16 comprising an OLED array 12 is greater than two. As noted, the OLED panels 16 are physically modular. Individual panels can be easily mounted onto and removed from the mount without disrupting the operation of other panels. An OLED panel 16 which becomes defective may be replaced by physically removing it from the OLED array 12 by disconnecting the OLED panel 16 from the mount 14. A replacement OLED panel 16, may then be inserted, properly aligned, and electrically connected to the mount 14. In one embodiment, different connector types are used for the anode and the cathode to ensure that the electrodes are not wired incorrectly.

Figure 2:
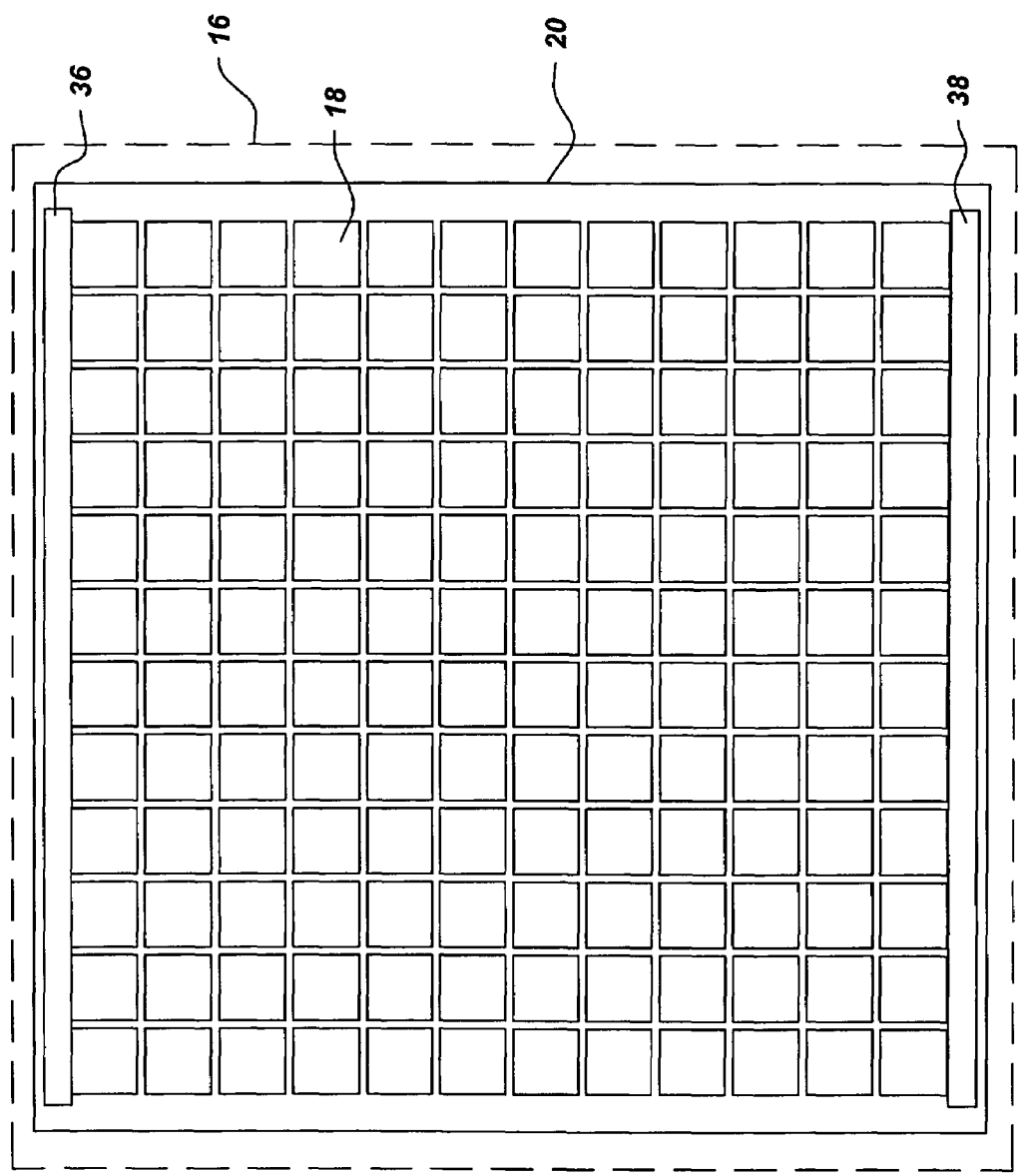
FIG. 2 shows schematically an OLED panel comprising individual OLED devices used in an embodiment of the present invention.
Figure 3:
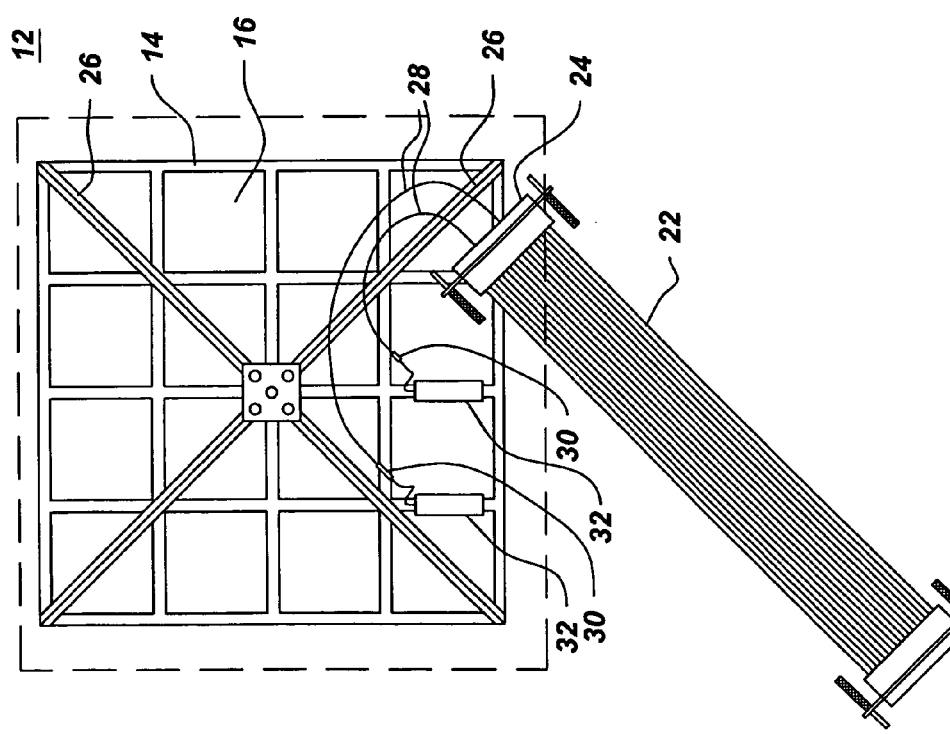
FIG. 3 shows schematically a "rear view" featuring the electrical connections of an embodiment of an area illumination source of the present invention.

As noted, the OLED panels 16 are electrically modular. The invention allows for the power delivered to each OLED panel 16 to be controlled independently. In one embodiment the OLED panels connected to the mount 14 both physically and electrically using "quick release" connectors. Electrical connections from the power supply to the OLED array 12 are made at the level of the individual panels 16, each OLED panel comprising a first 36 and second electrode 38. From the OLED panel, power is delivered to the individual OLED devices 18 (FIG. 2) which comprise OLED panel 16 (FIG. 1, FIG. 2). In one embodiment, the OLED panel 16 is equipped with bussed conductive lines, enabling external electrical connections to the individual electrodes of the devices. The bussed lines have electrical connectors, which enable the electrical isolation of the OLED panel 16 from the OLED array 12. Thus, the OLED panels are both physically and electrically modular. In addition, the OLED panels may be fastened to the mount by other means for greater robustness, such as using hold-down boards 32 (FIG. 3). The area illumination source further includes a power supply unit 40 (FIG. 1) comprised of a power supply source 41 and a control box 42. The power supply unit is capable of delivering varying levels of voltage simultaneously to of each of the individual OLED panels 16 by means of the controller 42. The controller 42 the supplies power to the individual panels 16 through ribbon cable 22. The power supply 40 is connected to each of the individual OLED panels at the first and second electrodes of the individual OLED panels.

FIG. 2 illustrates an OLED panel according to one embodiment of the present invention. The OLED panel 16 of FIG. 2 comprises one hundred and forty-four individual OLED devices 18 disposed upon substrate 20.

In one embodiment of the present invention the area illumination source 10 comprises a mount 14 (FIG. 1, FIG. 7) made from a light-transmissive material. For example, the mount 14 may comprise a thermoplastic light-transmissive material such as polycarbonate, or polyarcylate. In another embodiment of the area illumination source the mount comprises a reflective material such as metal. In some embodiments where the mount 14 comprises a light transmissive material, the mount may also further comprise a reflective material. The reflective material may be a metallized light transmissive material. In one embodiment the mount 14 comprises a transparent polycarbonate which has been "mirror finished" to be reflective. In another embodiment the mount 14 comprises a metallized polycarbonate, such as bisphenol A polycarbonate comprising an aluminum surface layer.

In one embodiment, the area illumination source of the present invention comprises at least two OLED panels that emit light of different colors. The color of the individual OLED panels may be customized by selection of the electroluminescent materials used in the OLED devices comprising the individual OLED panels. The color of the OLED panel 16 (FIG. 2) may also be varied using light-absorbing layers, or filter layers in the component OLED devices 18 (FIG. 2). Color filters may also be provided over each individual OLED device, over each OLED panel, or over an array of OLED panels (i.e. an OLED array).

Figure 5:
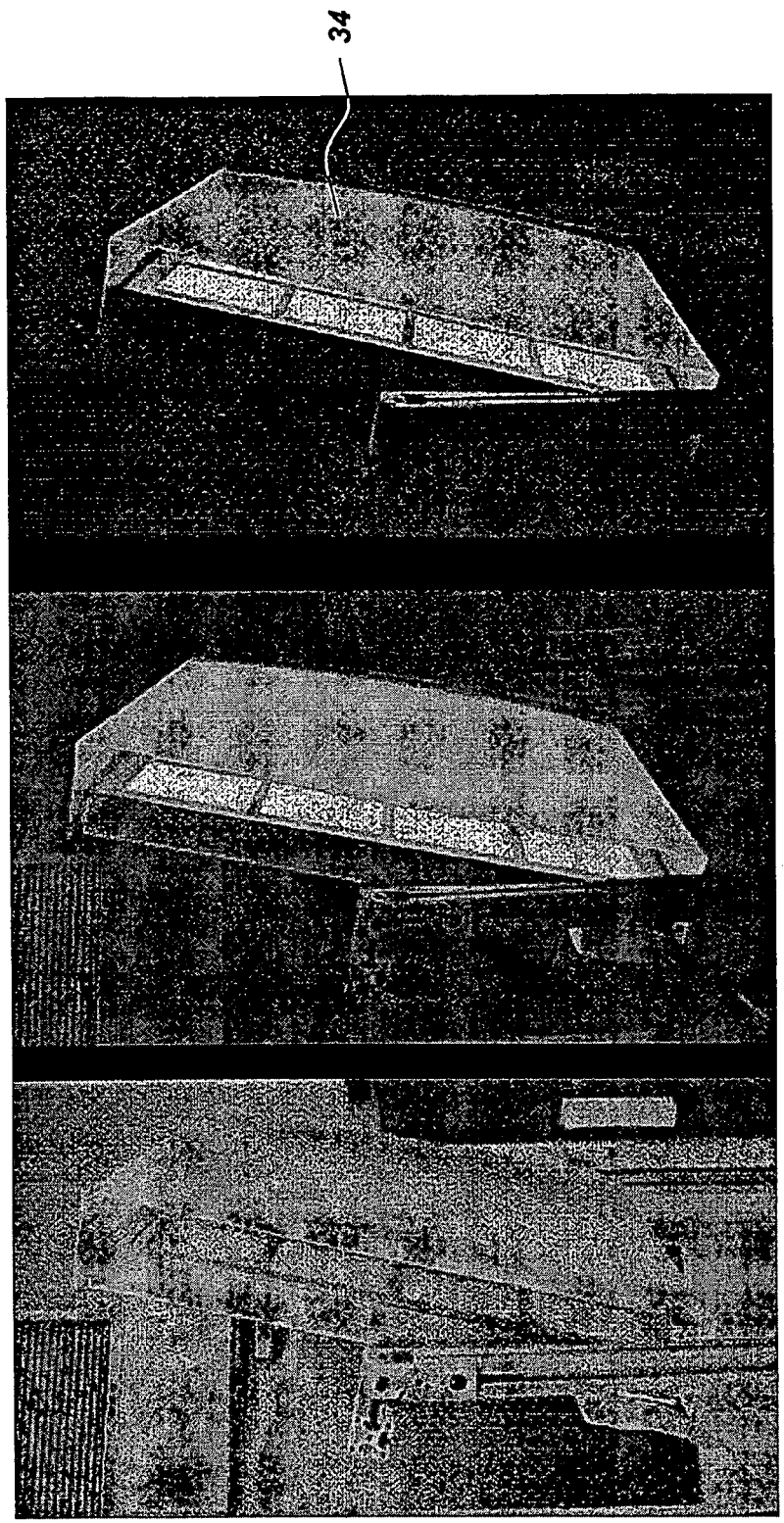
FIG. 5 shows schematically an embodiment of an area illumination source of the present invention comprising a light diffuser.

In another embodiment of the present invention at least one of the individual OLED devices further comprises a phosphor material. In an alternate embodiment, the area illumination source comprises at least one light management layer. The light management layer may comprise a phosphor material. In an embodiment of the present invention shown in FIG. 5, the light management layer comprises a light diffuser 34. In certain embodiments phosphor tapes are used for light management purposes and additionally help to cushion the panels when they are affixed to the mount and provide additional robustness to the entire area illumination source. Suitable phosphor tapes typically comprise one or more silicone materials which provide for resilience and cushioning of the OLED panel within the mount. This is particularly desirable when the mount is made of a hard material such as a ceramic or a metal.

Figure 6:
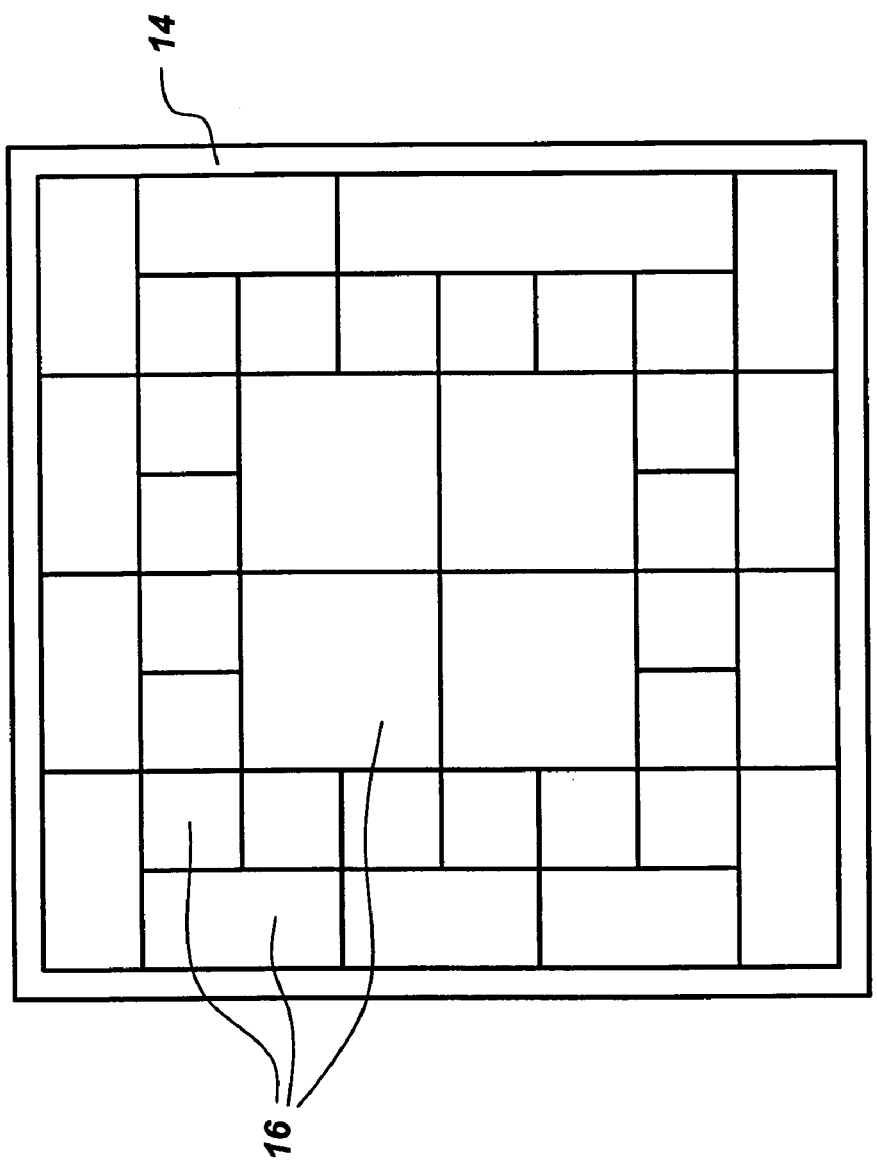
FIG. 6 shows schematically OLED array comprising OLED panels of differing sizes and shapes used in an embodiment of the present invention.
Figure 7:
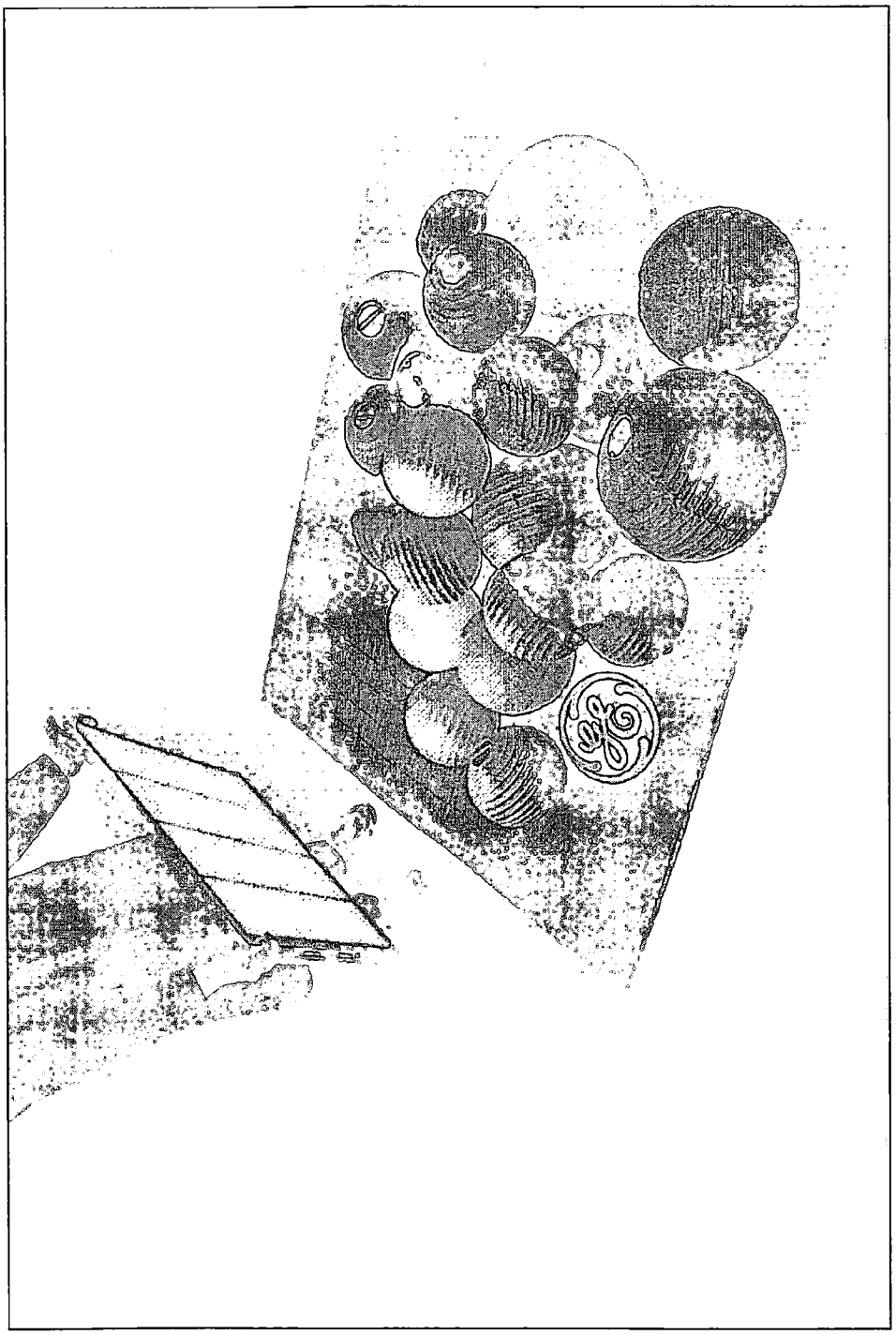
FIG. 7 shows schematically an embodiment of an area illumination source of the present invention that is portable.

The area illumination source of the present invention while providing illumination can also be customized to increase the decorative or aesthetic value of the illumination source. In one embodiment of the present invention, such as shown in FIG. 6, the area illumination source comprises at least two OLED panels 16 of different sizes. In another embodiment of the present invention, the area illumination source comprises at least two OLED panels 16 of different shapes. In a further embodiment of the present invention as shown in FIG. 7, the area illumination source is portable.

In one embodiment, the external power source is a standard AC power source, for example, the power supplied to a house or office at 110 V or 220 V. In such an embodiment, the power supply unit may additionally include voltage converters for converting the power supply voltage to a voltage useable by the OLED panels. The power supply unit in addition may also have an AC to DC converter. The OLED panels and devices may additionally include electric circuit elements to enable modification of the supply voltage to a voltage with a particular waveform and magnitude useable by the OLED devices.

In an alternative embodiment, the power supply unit is a DC power source such as a 24 V DC power source, a 12 V DC power source, or a 6 V DC power source. Suitable DC power sources include but are not limited to batteries. The power supply unit may additionally include voltage converters for converting a first power supply voltage to a second voltage to be applied to one or more of the OLED panels. The OLED panels and OLED devices may additionally include electric circuit elements that permit modification of the supply voltage to a voltage with a particular waveform and magnitude thereby customizing the voltage applied to individual OLED panels and individual OLED devices.

In another embodiment the power supply unit may additionally include a converter to convert an AC voltage into, a pulsed source with arbitrary DC offset positive or negative. This is one non-limiting example of a way to improve the overall life of the device.

In one embodiment, the power supply unit comprises a power supply source, outputting a single voltage, and a control box, which may be configured to produce different voltages, which then are supplied to the panels. The control box may further comprise controllers which independently control the power supply to each OLED panel. The power supply unit may have may further comprise one or more additional features, such as an AC on/off switch, a DC on/off switch, a switch to set all panels at constant voltage, or a controller to set the constant voltage. The power supply unit may additionally have timers to switch the OLED array on or off at preset times, and indicators to suggest the state of powering of the OLED. Indicators may be included to monitor if there is power to the control box, individual controllers and/or power to the lighting array.

Figure 4:
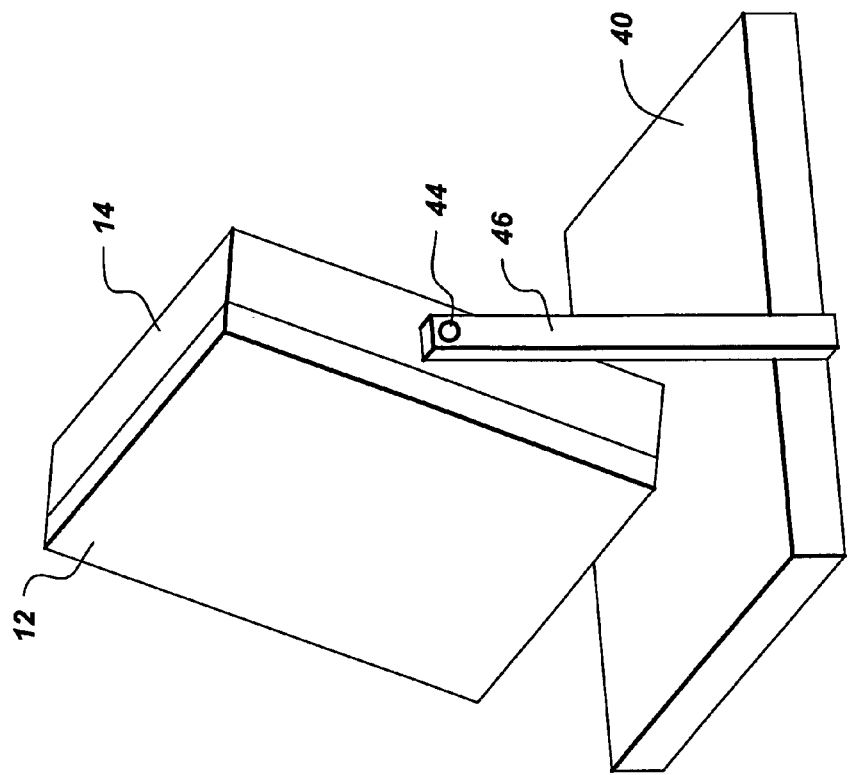
FIG. 4 shows schematically an embodiment of an area illumination source of the present invention with a swivel mount.

In one embodiment, the area illumination source is mountable onto a structure. In a non-limiting example, the mount within which the OLED panels are arrayed is adapted for wall mounting. In another example the mount is adapted for ceiling mounting. The OLED array may be mounted upon the ceiling or be suspended from the ceiling. In an alternative embodiment, the area illumination source is free standing. For example, the area illumination source is adapted for mounting upon a floor structure. FIG. 4 shows an embodiment of a free standing OLED area illumination source. FIG. 4 also shows an embodiment of the present invention wherein the mount 14 is joined to a stand 46 via a swivel mount 44, said stand 46 being affixed to a power supply unit 40.

The OLED area illumination sources of the present invention may comprise a wide variety of OLED devices and OLED device architectures. In one non-limiting example, the OLED device comprises an anode layer, a light-emitting organic layer, and a cathode layer. In another non-limiting example, the OLED device comprises an anode layer, an organic stack, and a cathode layer. The organic stack comprises at least one electroactive light emitting layer, and may further comprise one or more layers selected from hole transport layers, electron transport layers, hole blocking layers, electron blocking layers, and the like. The various layers of the OLED devices may be arranged in a variety of configurations.

The OLED device may include additional components as well, such as, one or more substrate layers, one or more adhesion layers, one or more sealant layers, one or more encapsulating layers, one or more abrasion resistant layers, one or more chemically resistant layers, one or more photoluminescent layers, one or more radiation-absorbing layers, one or more radiation reflective layers, one or more conductive layers, and one or more current limiting elements. Suitable substrates include rigid materials such as glass, flexible such as plastic films, and materials which comprise both rigid and flexible components, for example a substrate which is a rigid metal coupon upon the surface of which is disposed a flexible plastic.

Connections from the anode and cathode of each individual OLED device provide electrical contact with the power source through the connectors 30 (FIG. 3) at the OLED panel level. A plurality of bussed conductors are located on the substrate 20 (FIG. 2) and electrically connect the anode and cathode of the individual OLED devices 18 disposed upon the substrate 20 to the connectors 30 (FIG. 3) of each of the individual OLED panels.

In order to illuminate an area the size of an average size room, an OLED array comprising approximately four square feet of light-emitting OLED panels is typically required. Light-emitting OLED panels are typically assembled individually and are then separately wired together to form an OLED array. For example, to construct an OLED area illumination source such as schematically represented in FIG. 3, the OLED panels 16 are first fabricated as individual panels. A six square inch panel comprising a 12×12 array of 144 devices is fabricated on a single substrate using a roll-to-roll process. Each of the component OLED devices comprises an anode layer, a cathode layer and a light-emitting layer. A plurality of conductors provides electrical contact between the anode and cathode of each OLED device and the power source through the connectors 30 (FIG. 3) at the panel level. A metallic square mount 14 approximately 25 inches per side in size is fabricated with individual square panel mounting frames about 6 inches per side in size. Sixteen OLED panels 16 are disposed on the mount and are secured to the mount using hold-down boards 32. An additional reflector may be adhered to one side of the OLED panel using an adhesive. A multi pin connector 24 (e.g. a 37 pin D type connector) at one end of a flexible ribbon cable 22 is connected to each individual OLED panel 16 via a plurality connecting wires 28 and connectors 30 (FIG. 3). The ribbon cable 22 links the OLED array 12 to the power supply unit 40 (FIG. 1).

Figure 8:
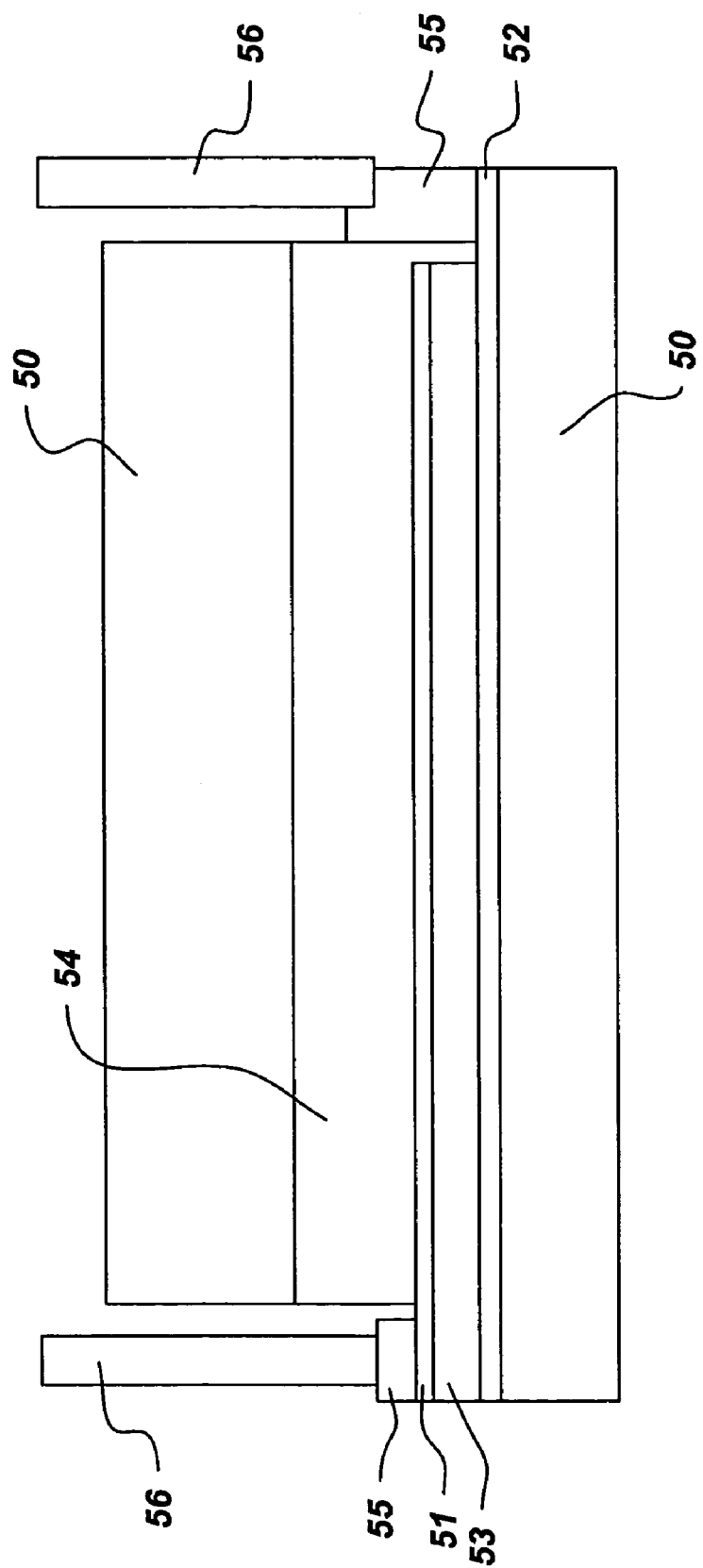
FIG. 8 shows schematically a "side view" of the electrical connections at the panel level of an embodiment of an area illumination source of the present invention.

FIG. 8 shows schematically a "side view" of the electrical connections at the panel level in one embodiment of the present invention. An organic light emitter 53 is sandwiched between an aluminum cathode 51 and an ITO anode 52. An adhesive layer 54 affixes the assembly comprising the light emitter 53, the anode 52, and the cathode 51 to the substrate 50 at the surface of the cathode 51. A second substrate 50 is in contact with the surface of the anode. A conductive strip 56 in combination with a conductive adhesive 55, is electrically connected to the anode 52 and the cathode 51.

While only certain features of the invention have been illustrated and described herein, many modifications and changes of the invention will be apparent to those skilled in the art. It is, therefore, to be understood that the appended claims are intended to cover all such modifications and changes as fall within the scope of the invention.

The invention claimed is:

1. An area illumination source comprising
   a plurality of individual OLED panels configured in a modular fashion, each of said OLED panels comprising a plurality of OLED devices, each of said panels comprising a first electrode and a second electrode;
   a power supply unit capable of delivering varying levels of voltage simultaneously to the first and second electrodes of each of the individual OLED panels; and
   a mount within which the individual OLED panels are arrayed;
   wherein said power supply unit is connected via a flexible ribbon cable comprising a multi-pin connector, said multi-pin connector being electrically connected to each individual OLED panel via a plurality of individual connectors.

2. The area illumination source according to claim 1 wherein said mount comprises light transmissive material.

3. The area illumination source according to claim 2, wherein the mount further comprises a reflective material.

4. The area illumination source according to claim 3, wherein the reflective material is a metal.

5. The area illumination source according to claim 3, wherein the mount comprises a metallized light transmissive material.

6. The area illumination source according to claim 1 wherein said mount is reflective.

7. The area illumination source according to claim 1, wherein the mount comprises a thermoplastic light-transmissive material.

8. The area illumination source according to claim 7, wherein the thermoplastic light-transmissive material is polycarbonate.

9. The area illumination source according to claim 1 wherein at least two of said OLED panels emit light of different colors.

10. The area illumination source according to claim 1 wherein at least two of said OLED panels are of different sizes.

11. The area illumination source according to claim 1 wherein at least one of the individual OLED devices further comprises a phosphor material.

12. The area illumination source according to claim 1 further comprising at least one light management layer.

13. The area illumination source according to claim 12 wherein said light management layer comprises a phosphor material.

14. The area illumination source according to claim 12 wherein said light management layer comprises a light diffuser.

15. The area illumination source according to claim 1 wherein said power supply unit comprises means for converting external supply voltage to a voltage useable by the OLED panels.

16. The area illumination source according to claim 1 wherein said area illumination source is free standing.

17. The area illumination source according to claim 1 wherein said area illumination source is mountable onto a structure.

18. The area illumination source according to claim 17, wherein the mount within which the OLED panels are arrayed is adapted for wall mounting.

19. The area illumination source according to claim 17, wherein the mount within which the OLED panels are arrayed is adapted for ceiling mounting.

20. The area illumination source according to claim 19, wherein the mount is adapted for suspension from a ceiling structure.

21. The area illumination source according to claim 19, wherein the mount is adapted for direct attachment to a ceiling structure.

22. The area illumination source according to claim 17, wherein the mount is adapted for mounting upon a floor structure.

23. The area illumination source according to claim 1, wherein the panels include a swivel mount.

24. The area illumination source according to claim 1, wherein the panels are mounted using quick release connectors.

25. An area illumination light source comprising:
a plurality of individual OLED panels configured in a modular fashion, each of said OLED panels comprising a first electrode and a second electrode;
a power supply unit for delivering varying levels of voltage simultaneously to the first and second electrodes of each of the individual OLED panels; and
a mount within which the OLED panels are arrayed;
wherein said power supply unit is connected through a flexible multipin ribbon cable to a series of electrical connectors contained within the mount, said electrical connectors being further connected to the individual OLED panels.

26. An area illumination light source comprising:
a plurality of individual OLED panels configured in a modular fashion, each of said OLED panels comprising a first electrode and a second electrode, at least two of said OLED panels emitting light of different colors, said OLED panels being mounted on a reflective substrate;
a power supply unit for delivering varying levels of voltage simultaneously to the individual OLED panels; and
a mount within which the OLED panels are arrayed;
wherein said power supply unit is connected through a flexible multipin ribbon cable to a series of electrical connectors contained within the mount, said electrical connectors being further connected to the individual OLED panels.

* * * * *